United States Patent [19]

Kawamura

[11] Patent Number: 5,294,556
[45] Date of Patent: Mar. 15, 1994

[54] METHOD FOR FABRICATING AN SOI DEVICE IN ALIGNMENT WITH A DEVICE REGION FORMED IN A SEMICONDUCTOR SUBSTRATE

[75] Inventor: Seiichiro Kawamura, Tokyo, Japan

[73] Assignee: Fujitsu Limited, Kawasaki, Japan

[21] Appl. No.: 733,119

[22] Filed: Jul. 19, 1991

[30] Foreign Application Priority Data

Jul. 20, 1990 [JP] Japan .................................. 2-192276

[51] Int. Cl.$^5$ .......................................... H01L 21/265
[52] U.S. Cl. .......................................... 437/21; 437/83;
437/84; 437/89; 437/924; 156/603; 156/604
[58] Field of Search .................. 437/83, 84, 21, 924,
437/89; 156/603, 604

[56] References Cited

U.S. PATENT DOCUMENTS

| 4,418,467 | 12/1983 | Iwai | 437/924 |
| 4,534,804 | 8/1985 | Cade | 437/924 |
| 4,573,257 | 3/1986 | Hulseweh | 437/924 |
| 5,106,432 | 4/1992 | Matsumoto et al. | 437/924 |
| 5,128,280 | 7/1992 | Matsumoto et al. | 437/924 |
| 5,157,003 | 10/1992 | Tsuji et al. | 437/924 |

FOREIGN PATENT DOCUMENTS 3-11658  1/1991  Japan .................................. 437/924

OTHER PUBLICATIONS

Fujita et al., J. Appl. Phys. 56(10)2986(1984) on "Effects of heating-temp. gradient and scanning direction on crystallographic properties of zone-melting recrystallized silicon on square shaped fused quartz".

Primary Examiner—Olik Chaudhori
Assistant Examiner—Ramamohan Rao Paladugu
Attorney, Agent, or Firm—Staas & Halsey

[57] ABSTRACT

A method of forming a semiconductor-on-insulator device comprises the steps of forming a first alignment mark on a semiconductor substrate at a first reference position, forming a diffusion region in the semiconductor substrate at a position defined with respect to the first alignment mark according to a predetermined relationship, providing an insulator layer on the semiconductor substrate to expose a part of an upper major surface of the semiconductor substrate, providing a semiconductor layer on the insulator layer in contact with the exposed upper major surface of the semiconductor substrate, recrystallizing the semiconductor layer by heating up to a temperature above a melting point of the semiconductor layer and cooling down subsequently below the melting point, starting from a part of the semiconductor layer in contact with the exposed upper major surface of the semiconductor substrate and moving laterally along the semiconductor layer, to form a single crystal semiconductor layer having an upper major surface formed with a depression at a second, different reference position, patterning the single crystal semiconductor layer using the depression on the upper major surface of the semiconductor layer as a second alignment mark to form a semiconductor device in alignment with the device region in the semiconductor substrate, wherein the first alignment mark at the first reference position is formed with an offset from the second reference position for the second alignment mark, the offset being chosen to cancel out an expansion of the single crystal semiconductor layer upon the step of recrystallization.

7 Claims, 7 Drawing Sheets

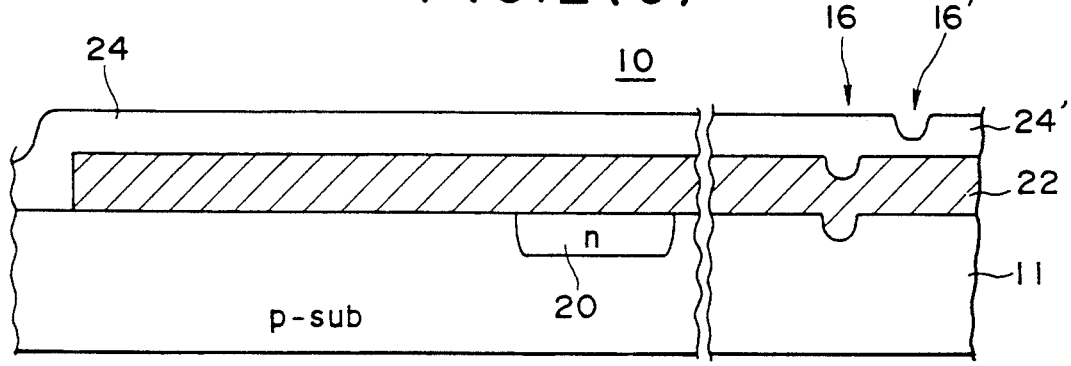

METHOD FOR FABRICATING AN SOI DEVICE IN ALIGNMENT WITH A DEVICE REGION FORMED IN A SEMICONDUCTOR SUBSTRATE

BACKGROUND OF THE INVENTION

The present invention generally relates to semiconductor devices, and in particular to a process for fabricating a semiconductor-on-insulator (SOI) device in alignment with a device region formed in a semiconductor substrate.

With the wide-spread use of electronic apparatuses, various semiconductor devices having various characteristics are required. In the display devices, for example, semiconductor devices having a high breakdown voltage are needed to drive the display driver with a high drive voltage. For this purpose, semiconductor-on-insulator (SOI) devices that are formed on an insulating substrate are well suited, as such a semiconductor device achieves a high breakdown voltage of 100-200 volts, without using a complex isolation structure.

In the SOI devices driven by high voltage, there arises a problem of backchannel effect wherein the channel region causes an inversion along the boundary thereof with the insulating substrate due to the large source or drain voltage. It should be noted that the surface of the substrate in contact with the channel region is maintained generally at the ground level. In order to eliminate the foregoing backchannel effect, a structure is proposed wherein the insulating substrate is provided on a semiconductor substrate, and a diffusion region is formed in the semiconductor substrate in correspondence to the SOI device. BY suitably biasing the diffusion region as a second gate, one can eliminate the formation of inversion layer and thus the backchannel effect.

In forming such an SOI device, it is necessary to provide a substrate structure wherein an insulator layer is provided on a semiconductor substrate as the insulating substrate, a diffusion region formed in correspondence to where the SOI device is to be formed as the second gate for eliminating the backchannel effect, and a single crystal semiconductor layer grown on the insulator layer as the active layer of the semiconductor device. In such a three-layer substrate, it will be understood that an alignment mark is necessary on the surface of the single crystal semiconductor layer in order to achieve the alignment of the SOI device that is formed in the upper, single crystal semiconductor layer with respect to the corresponding diffusion region formed in the lower semiconductor substrate.

FIGS. 1(A) and 1(B) show a conventional three-layer substrate body 10 respectively in a plan view and a cross sectional view.

Referring to the drawings, the three-layer substrate body 10 comprises a semiconductor substrate 11 doped, for example, to the p-type, an insulator layer 22 provided on the substrate 10 as the insulating substrate of SOI device, and a single crystal silicon layer 24 grown further on the insulator layer 22 as the active layer of the SOI device. In the substrate 11, a diffusion region 20 is formed as the second gate of the SOI device for eliminating the backchannel effect.

In order to establish a proper alignment between the SOI device and the underlying diffusion region, there is provided an alignment mark 16 on the surface of the substrate body 10 as shown in the plan view of FIG. 1(A). In the cross sectional view, the alignment mark 16 is formed with a predetermined relationship to the diffusion region 20 such that the SOI device can be formed on the single crystal silicon layer 24 exactly in correspondence to the diffusion region 20.

The three-layer semiconductor body 10 may be formed by the processes of: forming a thin oxide layer (not shown) on the surface of the semiconductor substrate 11; providing a photoresist layer (not shown) on the oxide layer; patterning the photoresist layer to form an opening exposing the surface of the oxide layer in correspondence to where the alignment mark 16 is to be formed; forming the alignment mark 16 by etching while using the photoresist layer as a mask such that the alignment mark penetrates through the oxide layer and invades into the substrate 11; removing the photoresist layer; providing a second photoresist layer; patterning the second photoresist layer using the alignment mark to expose a region where the diffusion region 20 is to be formed, applying an ion implantation process using the photoresist as the mask; removing the second photoresist layer; oxidizing the semiconductor body 10 to grow a thin oxide layer comprising the insulator layer 22; depositing a polysilicon layer (not shown) on the insulator layer 22, and annealing the polysilicon layer to form the single crystal layer 24. Thereby, the alignment mark 16 is transferred to the surface of the single crystal layer 24 as a depression. Using this depression as the alignment mark, the single crystal layer 24 is patterned and the SOI device is formed in correspondence to the diffusion region 20. By using the diffusion region 20 as the second mask, one can eliminate the problem of the backchannel effect as described previously.

Several processes are available for annealing the polysilicon layer to form the single crystal silicon layer 24. For example, one can employ the laser beam heating process to cause the polysilicon layer to melt and crystallize into the single crystal layer. This process, however, has a problem in the quality of the resulting single crystal silicon layer 24, as the silicon layer 24 thus formed tends to exhibit a deterioration in the drain breakdown voltage, an increase in the on-state resistance, variations in the device characteristics, and the like, due to the sub-grain boundaries included in the layer 24. In the laser beam melting, it will be understood that the formation of uniform, defect-free single crystal layer throughout the surface of the substrate body 10 is extremely difficult because of the lack of the epitaxial relationship.

In order to circumvent the foregoing problem, use of a process called zone-melting-recrystallization (ZMR) is proposed.

FIGS. 2(A) and 2(B) show a conventional ZMR process. Referring to the plan view of FIG. 2(A), the insulator layer 22 is formed to expose a marginal part of the semiconductor substrate 11 that may have a (001) oriented surface and a thickness of about 500 μm. On the insulator layer 22, a polysilicon layer 24' is deposited in contact with the exposed (001) surface of the substrate 11 as shown in the cross sectional view of FIG. 2(B) with a thickness of about 5000 Å and the substrate body 10 is passed through a heating fixture including carbon strip heaters 101 and 102 as shown by the arrow in FIG. 2(A). Upon passage through the heating fixture 101 and 102, the polysilicon layer 24' is caused to melt by heating to a temperature of about 1450° C. and then is recrystallized to form the single crystal layer 24. As the melting and recrystallization starts at the marginal part where the polysilicon layer 24' is in contact with the exposed (001) surface, the layer 24 has the same crystal orientation throughout the substrate body 10 and the problem of the sub-grain boundary formed in the layer 24 is eliminated.

In such a ZMR process, it will be noted that the lower carbon strip heater 102 should be driven with a power that is lower than the power used to drive the carbon strip heater 101 such that the substrate 11 is not heated excessively and the migration of impurities out of the diffusion region 20 does not occur. For example, the temperature of the substrate 11 is held at 1300° C. However, such a temperature difference causes a large thermal stress in the substrate body 10 between the recrystallized silicon layer 24 and the underlying silicon substrate 11.

Further, it was found that the position of the alignment mark 16 moves laterally after the ZMR process. More specifically, the applicant of the present invention has found that the alignment mark 16 moves laterally toward the marginal area of the substrate body 10 as shown by a mark 16' in FIG. 1(A) when the ZMR process is applied. In the case of a circular substrate body 10 having a diameter of 4 inches with a pair of alignment marks 16 formed on diametrically opposing positions with a separation of 6–7 cm, the amount of movement can reach as much as 1 μm for each alignment mark 16. Thereby, one encounters a problem in the alignment of the mask used for patterning the single crystal layer 24 to form the SOI device with respect to the diffusion region 20 formed in the substrate 11.

Although the cause of this phenomenon is not completely explored, it is thought probable that the polysilicon layer 24' undergoes a lateral expansion upon melting, and the alignment mark 16, formed on the surface of the layer 24', moves to the position 16' accordingly. It should be noted that silicon increases the volume thereof upon melting. Upon cooling, the molten silicon layer solidifies at about 1415° C. and the relative positional relationship between the new alignment mark 16' and the original alignment mark 16 is established thereby. It should be noted that, during this process, the substrate 11 is held at about 1300° C. or less to avoid the diffusion of the impurities away from the diffusion region 20. Thus, even when a shrinkage occurs in the recrystallized silicon layer 24 upon the solidification to cancel out the expansion at the time of melting, the alignment mark 16' does not return to the original position 16 because of the temperature difference between the layer 24 and the substrate 11. Thereby, it is believed, though not confirmed yet, that the substrate body 10 thus formed by the ZMR process has a cross section as shown in FIG. 2(C) wherein the alignment mark 16' in the recrystallized single crystal layer is offset laterally to the alignment mark 16 formed in the substrate 11.

When one uses the alignment mark 16' at the time of patterning the single crystal silicon layer 24 to form an SOI device, it will be understood that no proper alignment is achieved between the SOI device thus formed and the diffusion region 20 formed in the substrate 11. Thus, there arises a difficulty in achieving the elimination of the backchannel effect described previously.

SUMMARY OF THE INVENTION

Accordingly, it is a general object of the present invention to provide a novel and useful process for fabricating an SOI device wherein the foregoing problems are eliminated.

Another and more specific object of the present invention is to provide a process for fabricating an SOI device on an insulating substrate that is formed on a semiconductor substrate, such that the SOI device is in an exact alignment with a diffusion region formed in a semiconductor substrate on which the insulating substrate of the SOI device is formed.

Another object of the present invention is to provide a process for fabricating an SOI device on a substrate body having an upper major surface and comprising a semiconductor substrate, an insulating layer provided on the semiconductor substrate, and a single crystal silicon layer formed on the insulating substrate by a recrystallization of a polysilicon layer, comprising the steps of providing an alignment mark on the substrate body in correspondence to a first reference position, forming a device region in the semiconductor substrate using the alignment mark as a reference mark, recrystallizing the polysilicon layer by a zone-melting-recrystallization process to form the single crystal silicon layer, and patterning the single crystal silicon layer using a mask to form the SOI device in correspondence to the device region formed in the substrate, said patterning being made while using the alignment mark as a reference mark located at a second reference position, wherein said step of forming the alignment mark on the polysilicon layer includes a step of forming the alignment mark such that the first reference position is offset from the second reference position toward the center of the substrate body, when viewed perpendicularly to the upper major surface of the substrate body, by a distance corresponding to the lateral expansion of the polysilicon layer that is caused at the time of the zone-melting-recrystallization. According to the present invention, the alignment mark at the second reference position corresponds to the alignment mark provided on the mask used for patterning the single crystal silicon layer at the time of fabrication of the SOI device, and the SOI device is formed exactly on the device region in the semiconductor substrate of the substrate body. Thereby, the backchannel effect in the SOI device is successfully eliminated.

Other objects and further features of the present invention will become apparent from the following detailed description when read in conjunction with the attached drawings.

DETAILED DESCRIPTION

FIGS. 3(A)–3(H) show the process for fabricating an SOI device according to an embodiment of the present invention.

Figure 3A:
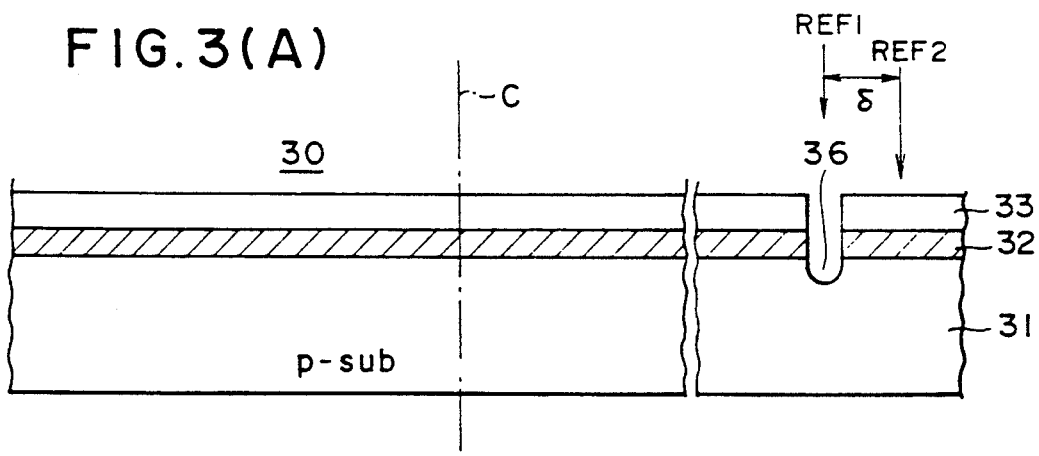
FIGS. 3(A)–3(H) are diagrams showing the process for fabricating an SOI device according to an embodiment of the present invention.

Referring to FIG. 3(A), a silicon substrate 31, doped to the p-type and having a resistivity of 20 Ωcm, for example, is subjected to a thermal oxidization process to form a silicon oxide layer 32 on the upper major surface of the substrate 31 with a thickness of about 50 nm.

Further, a photoresist layer 33 is provided on the silicon oxide layer 32 and is patterned subsequently to form an opening that exposes the surface of the layer 32 in correspondence to a first reference position REF1. As will be described later in detail, this first reference position REF1 is set at a position, to offset from a second reference position REF2 that is used for patterning the SOI device, toward the central axis C of the substrate 31. Here, it is assumed that the substrate 31 has a generally circular form with the hypothetical central axis C and has a thickness of about 500 μm. See the plan view of FIG. 4. Further, an etching step is performed, using the photoresist 33 as a mask and a solution of KOH as an etchant, to a depth of 1.5-2 μm, and an alignment mark 36 is formed as illustrated. The alignment mark 36 may have a rectangular form when viewed perpendicularly to the upper major surface of the substrate 31, with the size of typically 5 μm × 7 μm. Thereby, a substrate body 30 carrying thereon the alignment mark 36 is obtained.

Figure 3B:
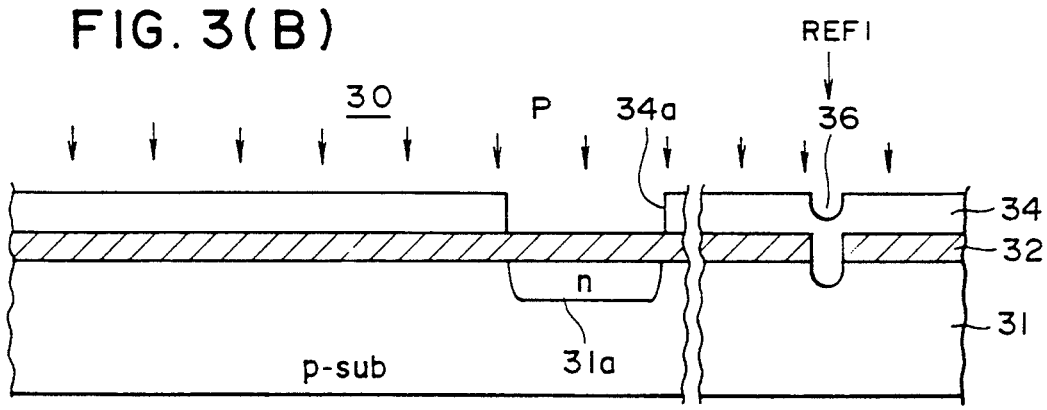

Next, the photoresist 33 is removed and another photoresist layer 34 is deposited on the surface of the silicon oxide layer 32. Further, the photoresist layer 34 is patterned, using the depression formed on the surface of the photoresist layer 34 in correspondence to the alignment mark 36, as the reference position. Thereby, an opening 34a is formed with a predetermined positional relationship to the alignment mark 36. Next, by using the photoresist 34 thus patterned as a mask, an ion implantation process of phosphorus is made with an acceleration voltage of 180 keV and a dose of $3 \times 10^{12}$ cm$^{-2}$. Thereby, an n-type well 31a is formed in the substrate 31 in correspondence to where the SOI device is to be formed as shown in FIG. 3(B).

Figure 3C:
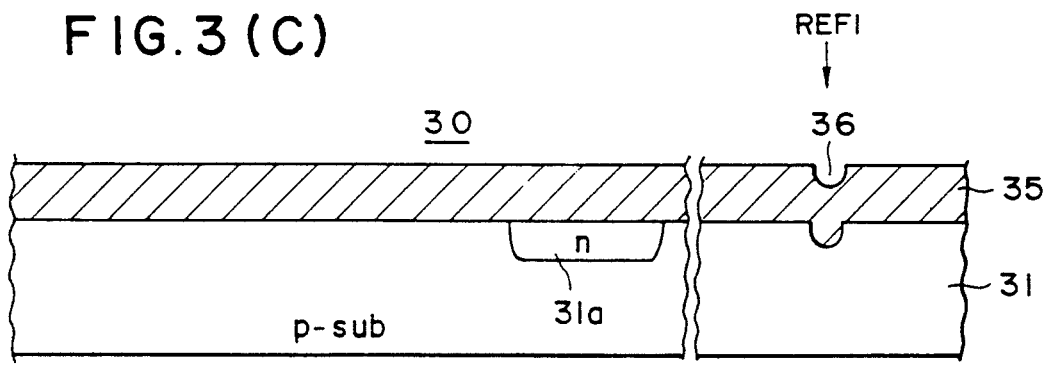

Next, the photoresist 34 is removed and an oxidation process is applied to the structure thus obtained at about 900° C. Thereby, the oxide layer 32 grows to a thickness of 1.5-2 μm to form an oxide layer 35 as shown in FIG. 3(C). The oxide layer 35, too, has an upper major surface formed with a depression in correspondence to the alignment mark 36 at the first reference position REF1. The oxide layer 35 also may be formed by depositing silicon oxide on the silicon oxide layer 35 by a CVD process. In this case, the temperature of the substrate 31 is held low and the migration of impurities outside the well 31a is avoided.

Figure 3D:
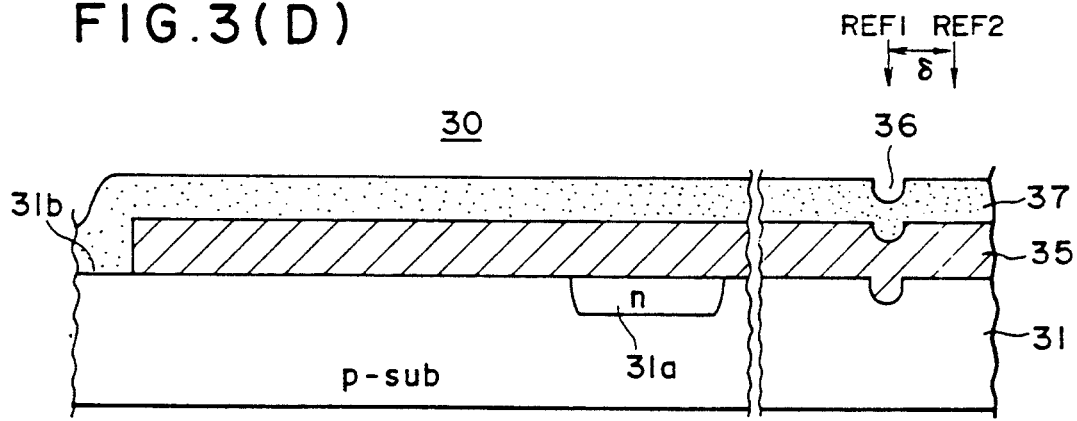
Figure 4:
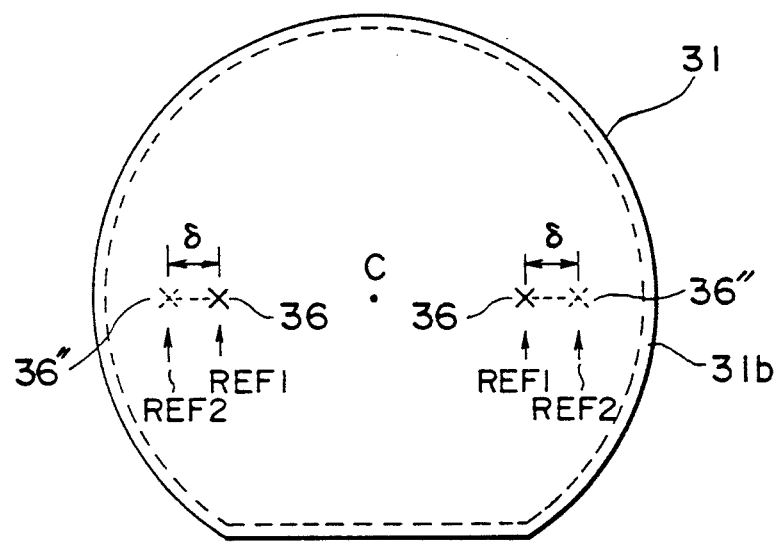
FIG. 4 is a plan view showing the substrate body formed by the process of FIGS. 3(A)–3(H).

In the step of FIG. 3(D), the silicon oxide layer 35 is applied with an etching process to expose the upper major surface of the substrate 31 in correspondence to a marginal area 31b. See the plan view of FIG. 4 showing such a marginal area 31b formed under a silicon layer provided on the silicon oxide layer 35. On the silicon oxide layer 35, a polysilicon layer 37 is deposited including the exposed marginal area 31b, with a thickness of 400-500 nm. Thereby, the structure shown in FIG. 3(D) is formed. In FIG. 3(D), the marginal area 31b acts as the seed region for a single crystal silicon layer on the silicon oxide layer 35.

Figure 1:
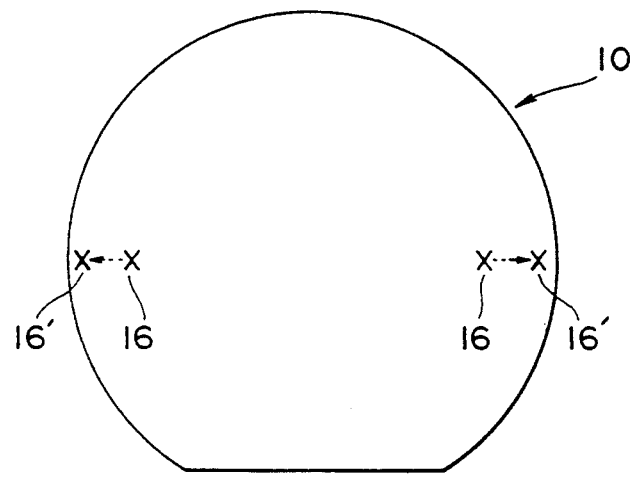
FIGS. 1(A) and 1(B) are diagrams showing a conventional substrate body used for forming an SOI device.
Figure 1B:
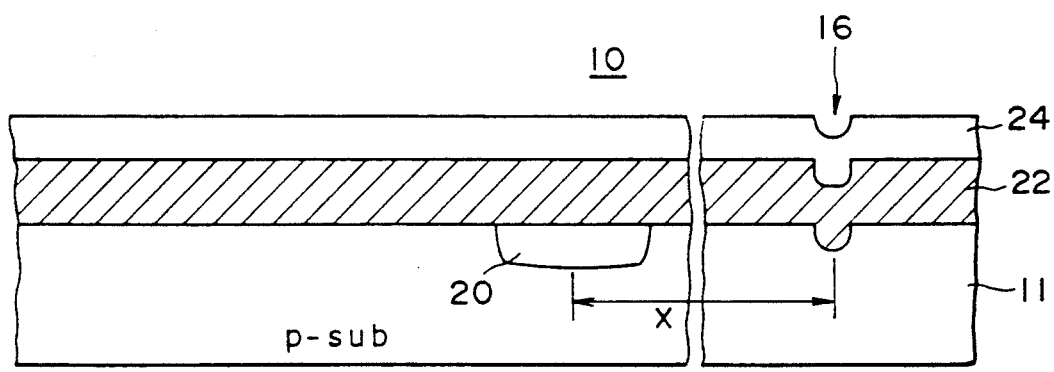
Figure 2:
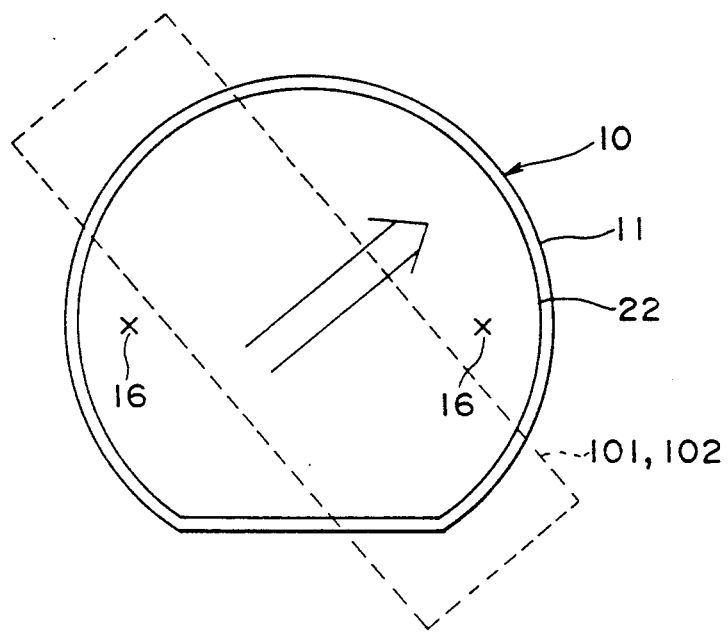
FIG. 2(A)–2(C) are diagrams showing a conventional process for forming the SOI device of FIGS. 1(A) and 1(B)
Figure 2:
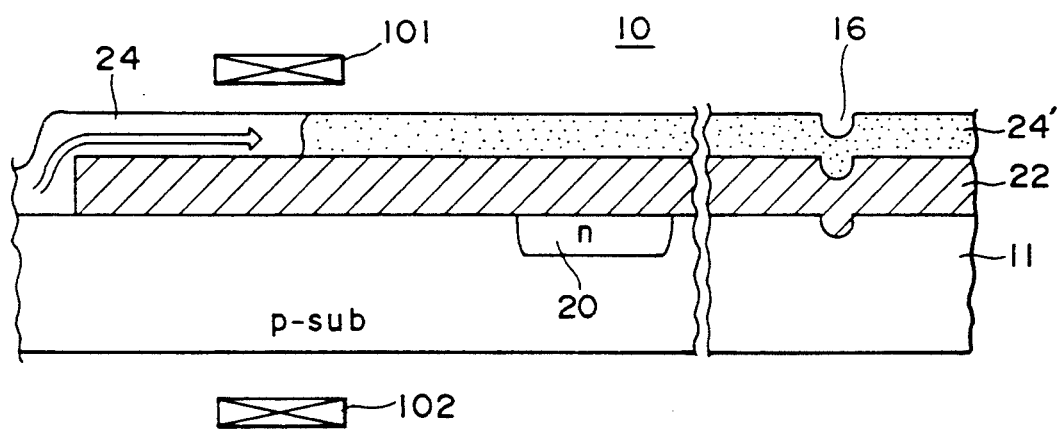
Figure 3E:
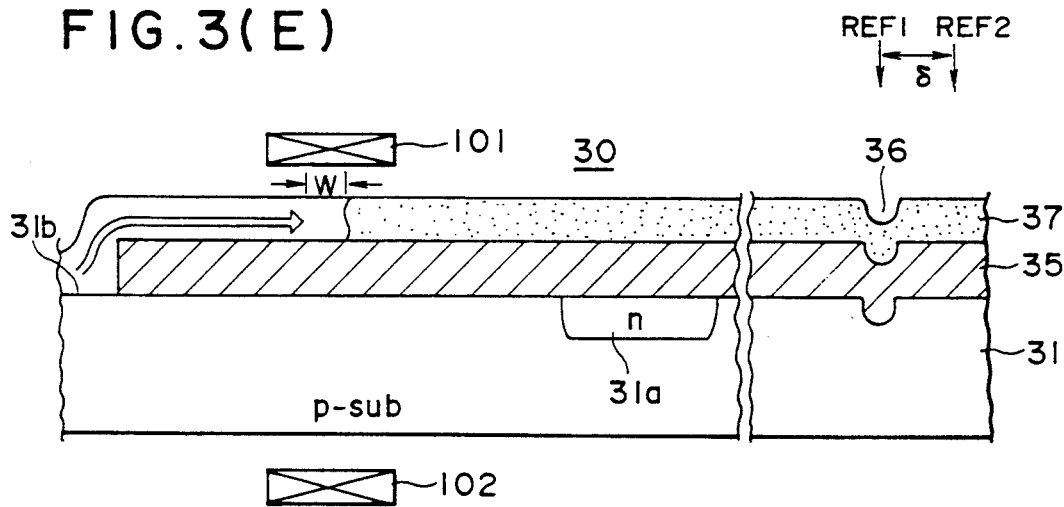

Next, the structure of FIG. 3(D) is passed through a heating fixture including the carbon strip heaters 101 and 102 similar to the case of the conventional process, except that the lower carbon strip heater 102 is driven with a power smaller than the conventional case such that the temperature of the substrate 31 is held lower than about 1200° C., preferably at about 1000° C. By maintaining the temperature of the substrate 31 as such, one can reduce the migration of impurities to the outside of the p-type well 31a. The upper heater 101, on the other hand, is energized with an energy that is substantially identical with the conventional case. Thereby the polysilicon layer 37 is heated to a temperature of about 1450° C. and undergoes melting. As the substrate 31 is transported through the region between the carbon strip heaters 101 and 102 with a speed of about a few millimeters per second, the region of melting moves across the substrate 31, starting from one end portion of the marginal area 31b and progressing to the other, diametrically opposed end of the marginal area 31b as shown in FIG. 3(E). See also FIG. 2(A) showing the ZMR process. Thereby, solidification starts from the first end portion of the seed region 31b and proceeds to the opposed end portion of the seed region 31b.

Figure 3F:
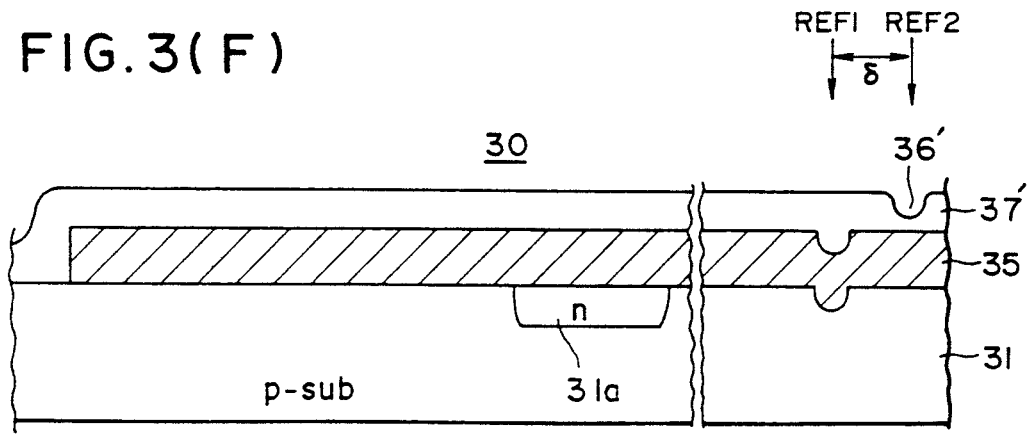
Figure 3G:
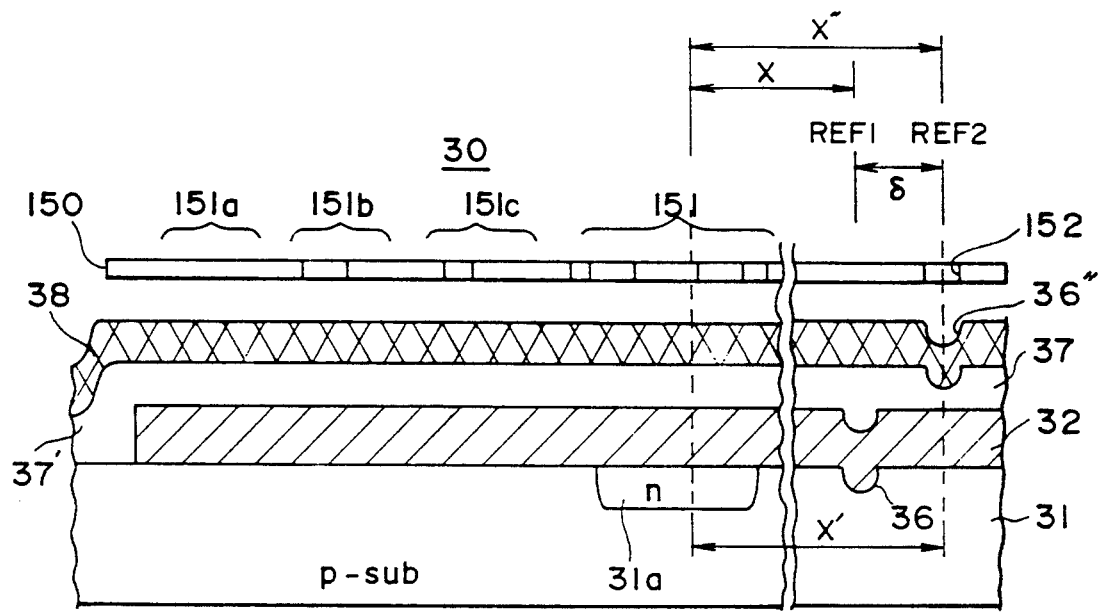

After the ZMR process has completed, a structure shown in FIG. 3(F) is obtained for the substrate body 30, wherein the polysilicon layer 37 is now converted to a single crystal silicon layer 37'. On the upper major surface of the single crystal silicon layer 37', a depression 36' acting as the alignment mark is formed in correspondence to the depression 36, wherein the depression 36' is now located at the second reference position REF2 that is offset from the first reference position REF1 in the radially outward direction by the distance δ. As described previously, the silicon layer 37' crystallizes at the temperature of 1415° C. that is substantially higher than the temperature of the substrate 31. It should be noted that the temperature of the substrate 31 is suppressed at or below about 1200° C. Thereby, the distance δ reaches the value as large as 1 μm, assuming the distance from the center of the substrate 31 to the alignment mark 36' of 3-3.5 cm.

Next, a photoresist layer 38 is deposited on the substrate body 30 of FIG. 3(F), and is patterned by using a mask 150. The mask 150 carries thereon a device pattern 151 and an alignment mark 152 used for establishing the alignment between the mask 150 and the substrate 31 such that the SOI device is formed exactly on (i.e., in alignment with) the diffusion region 31a.

On the surface of the photoresist 38, a depression 36" appears in correspondence to the alignment mark 36', and the device pattern 151 on the mask 150 is aligned with respect to the well 31a in the substrate 31, by using the depression 36" as the alignment mark. More particularly, the alignment mark 152 on the mask 150 is aligned with the depression 36" located at the second reference position REF2, and the patterning of the SOI device is achieved exactly in alignment with the p-type well 31a. There, the reference position REF2 is determined at a distance X' with respect to the diffusion region 31a in correspondence to the distance X" between the alignment mark 152 on the mask 150 and the device pattern 151 also on the mask 150.

It should be noted that, in order to achieve the foregoing relationship, it is necessary to set the distance X' and X" to be larger than the distance X by the distance δ. Thus, the present invention sets the original depression 36 at a position which is offset inwardly from the position of the alignment mark 36" on the surface of the substrate body 30, in advance. This offset δ is thought to be determined generally by the difference in the thermal expansion between the substrate 31 and the silicon layer 37' at the time the ZMR process is applied, although the contribution of other processes than the thermal expansion is not excluded.

Figure 3H:
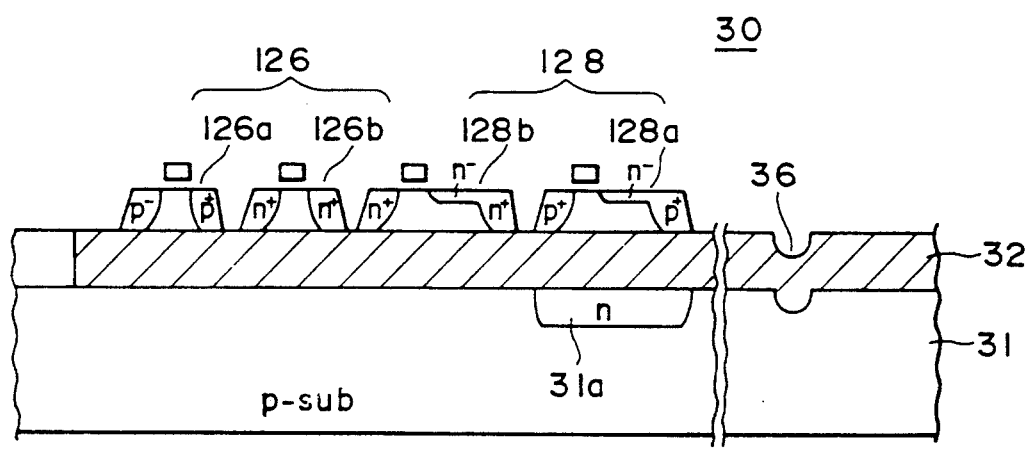

After the mask 150 is aligned with respect to the diffusion region 31a, the single crystal silicon layer 37' is patterned according to the device pattern 151 as well as other device patterns 151a-151c on the mask 150, and SOI devices 126 (i.e., 126a and 126b) and 128 (i.e., 128a and 128b) are formed as shown in FIG. 3(H) It should be noted that the SOI device 128a that is formed by the pattern 151 is formed in exact alignment with the diffusion region 31a formed in the substrate 31.

FIG. 4 shows the substrate body 30 in the plan view. Referring to FIG. 4, the original alignment mark 36 is located closer to the hypothetical center line C of the body 30 by the distance $\delta$ of about 1 $\mu$m. As noted previously, this offset $\delta$ is determined by the expansion of the single crystal layer 27' with respect to the substrate 31 at the time of the ZMR process. In the experiments conducted by the inventor for the 4 inch wafer, the single crystal silicon layer 37 expands by about 2 $\mu$m in total, indicating the outward movement of 1 $\mu$m for each alignment mark 36 as already explained. Thus, the offset $\delta$ is set to about 1 $\mu$m in the above embodiment.

Further, the present invention is not limited to the embodiments described heretofore, but various variations and modifications may be made without departing from the scope of the invention.

What is claimed is:

1. A method of forming a semiconductor-on-insulator device, comprising the steps of:
    forming a first alignment mark on an upper major surface of a semiconductor substrate at a first reference position;
    forming a device region in the semiconductor substrate at a position located a selected distance from the first alignment mark, said device region including a diffusion region having an impurity element;
    providing an insulator layer on the upper major surface of the semiconductor substrate, said insulator layer having an upper major surface with a depression therein at the first reference position in correspondence with the first alignment mark, said insulator layer being configured so as to expose a part of the upper major surface of the semiconductor substrate;
    providing a semiconductor layer having corresponding first and second portions respectively on the upper major surface of the insulator layer and on, and in contact with, the exposed part of the upper major surface of the semiconductor substrate, said semiconductor layer having an upper major surface with a first depression therein at the first reference position in correspondence with the first alignment mark;
    recrystallizing the semiconductor layer by heating same to a first temperature, above the melting point temperature of the semiconductor layer, and cooling same subsequently to a second temperature, below the melting point temperature and less than the first temperature, starting from the second portion of the semiconductor layer in contact with the exposed part of the upper major surface of the semiconductor substrate and moving therefrom, laterally along the semiconductor layer, thereby to form a single crystal semiconductor layer having an upper major surface with a second depression therein at a second, different reference position; and
    patterning the single crystal semiconductor layer using the second depression in the upper major surface of the semiconductor layer as a second alignment mark and thereby to form a semiconductor device in alignment with the device region in the semiconductor substrate, the first reference position of said first alignment mark being offset from the second reference position of the second alignment mark by an amount corresponding to, and thereby cancelling out, the expansion of the single crystal semiconductor layer caused by the recrystallizing step.

2. A method as claimed in claim 1 in which said semiconductor substrate has a generally circular configuration with a diameter of about 4 inches, said offset being about 1 $\mu$m in a radial direction toward a central part of the semiconductor substrate.

3. A method as claimed in claim 2 in which said first alignment mark is formed to oppose diametrically on the upper major surface of the semiconductor substrate.

4. A method as claimed in claim 1 wherein said recrystallizing step further comprises maintaining the semiconductor substrate at a temperature which does not cause migration of the impurity element from the diffusion region.

5. A method as claimed in claim 4 in which said temperature is 1200° C. or less.

6. A method as claimed in claim 5 in which said temperature is 1000° C.

7. A method as claimed in claim 1 wherein said patterning further comprises aligning a mask, which carries thereon an alignment mark and a device pattern relatively spaced by a distance identical with said selected distance between the first alignment mark and the device region on the upper major surface of the substrate, with respect to the single crystal semiconductor layer and such that the alignment mark of the mask aligns with the second alignment mark on the single crystal semiconductor layer.

* * * * *